(12) United States Patent
Taylor et al.

(10) Patent No.: US 8,874,999 B1
(45) Date of Patent: Oct. 28, 2014

(54) PULSE WIDTH DETERMINATION FOR PHASE DETECTION

(75) Inventors: David F. Taylor, Edinburgh (GB); Matthew H. Klein, Redwood City, CA (US); Vincent Vendramini, Dublin (IE)

(73) Assignee: Xilinx, Inc., San Jose, CA (US)

( * ) Notice: Subject to any disclaimer, the term of this patent is extended or adjusted under 35 U.S.C. 154(b) by 339 days.

(21) Appl. No.: 13/362,505

(22) Filed: Jan. 31, 2012

(51) Int. Cl.
*H03M 13/00* (2006.01)

(52) U.S. Cl.
USPC .......................................................... 714/775

(58) Field of Classification Search
CPC ........ H03K 3/017; H03L 7/085; H03L 7/087; H04B 14/026; H04L 25/026
USPC ......................................... 714/775, 798, 799
See application file for complete search history.

(56) References Cited

U.S. PATENT DOCUMENTS

| | | | |
|---|---|---|---|
| 5,206,861 A | | 4/1993 | Hannon et al. |
| 5,646,519 A | * | 7/1997 | Hamilton et al. .......... 324/76.82 |
| 5,889,435 A | | 3/1999 | Smith et al. |
| 5,927,173 A | * | 7/1999 | Lyons et al. ..................... 83/650 |
| 6,374,361 B1 | | 4/2002 | Lee et al. |
| 6,470,483 B1 | | 10/2002 | Rodriguez et al. |
| 6,779,123 B2 | | 8/2004 | Simon et al. |
| 6,983,394 B1 | | 1/2006 | Morrison et al. |
| 7,251,765 B2 | * | 7/2007 | Kushiyama et al. .......... 714/733 |
| 7,734,002 B2 | * | 6/2010 | Yi ................................... 375/376 |
| 8,265,218 B2 | * | 9/2012 | Kim et al. ...................... 375/375 |
| 2009/0052508 A1 | * | 2/2009 | Takahashi ...................... 375/219 |
| 2011/0221476 A1 | * | 9/2011 | Nesreen et al. .................... 327/3 |
| 2012/0092052 A1 | * | 4/2012 | Matsuda ......................... 327/158 |

OTHER PUBLICATIONS

U.S. Appl. No. 13/030,558, filed Feb. 18, 2011, Klein, Matthew, H., et al., Xilinx, Inc., 2100 Logic Drive, CA.
Wolaver, Dan, H., "Phase-Locked Loop Circuit Design", Feb. 8, 1991,.pp. 61-64, Prentice Hall.

* cited by examiner

*Primary Examiner* — Phung M Chung
(74) *Attorney, Agent, or Firm* — W. Eric Webostad

(57) ABSTRACT

An embodiment of an apparatus includes a detector to receive a first input signal and a second input signal to provide a first error signal and a second error signal. A pulse width determination block receives the first and second error signals, as well as a digital oscillating signal, to output a first pulse width value and a second pulse width value, respectively. A pulse width accumulator accumulates the first and second pulse width values responsive to at least one cycle of the digital oscillating signal to provide a first accumulated value and a second accumulated value. An error generator provides an error value as a difference between the first accumulated value and the second accumulated value. The error value represents a pulse width difference between the first input signal and the second input signal indicative of a phase difference between the first input signal and the second input signal.

20 Claims, 8 Drawing Sheets

US 8,874,999 B1

PULSE WIDTH DETERMINATION FOR PHASE DETECTION

FIELD OF THE INVENTION

An embodiment relates to integrated circuit devices ("ICs"). More particularly, an embodiment relates to pulse width determination for phase detection in an IC.

BACKGROUND

A conventional digital phase frequency detector ("PFD") of a conventional digital phase lock loop ("DPLL") may generate too much jitter in loop bandwidth ("LBW"). For example, in a system having a serial digital interface having a 2.970 gigabit per second serial link, namely, a 3G-SDI system; PFD introduced jitter may marginalize system performance. Additionally, a core clock of an IC may not have sufficient phase resolution, and thus phase jitter may be exacerbated.

Known solutions to compensate for jitter include addition of dither and oversampling. Addition of error or dither in a DPLL loop may reduce phase error spiking, but low level loop linearity and/or "floor-level" phase noise may continue to significantly limit system performance. Use of a fast sampling clock for high-speed oversampling may be available in some ICs that allow for multiple phases of clock generation; however, some ICs may not have this capability. Furthermore, use of clock buffers and/or chip power for providing such a fast sampling clock may add cost. Along those lines, adding dither and/or oversampling may be too expensive for some applications.

Accordingly, it may be useful to provide a less expensive solution to reduce jitter than those previously described.

SUMMARY

One or more embodiments generally relate to pulse width determination for phase detection in an IC.

An embodiment relates generally to an apparatus. In such an embodiment, included is a detector to receive a first input signal and a second input signal to provide a first error signal and a second error signal. A pulse width determination block is for receiving the first error signal, the second error signal and a digital oscillating signal to output a first pulse width value and a second pulse width value respectively associated with the first error signal and the second error signal. A pulse width accumulator is for accumulating the first pulse width value and the second pulse width value responsive to at least one cycle of the digital oscillating signal to provide a first accumulated value and a second accumulated value. An error generator is for providing an error value as a difference between the first accumulated value and the second accumulated value. The error value represents a pulse width difference between the first input signal and the second input signal indicative of a phase difference between the first input signal and the second input signal.

Another embodiment relates generally to another apparatus. In such an embodiment, a first delay chain and a second delay chain are included. The first delay chain is for receiving a first pulse associated with a first type of difference between a first input signal and a second input signal, and the second delay chain is for receiving a second pulse associated with a second type of difference between the first input signal and the second input signal. A plurality of first registers is coupled to the first delay chain, and a plurality of second registers is coupled to the second delay chain. The plurality of first registers and the plurality of second registers each have clock input ports for clocking with a digital oscillating signal. First summing circuitry is coupled to first data outputs of the plurality of first registers to provide a first pulse width value, and second summing circuitry is coupled to second data outputs of the plurality of second registers to provide a second pulse width value.

Another embodiment relates generally to a method for pulse width determination. In such an embodiment, differences between a first input signal and a second input signal are detected to provide a first error signal associated with a first type of difference and a second error signal associated with a second type of difference. Using a first delay chain, a first pulse of the first error signal is progressively delayed. A second pulse of the second error signal is progressively delayed. Responsive to a digital oscillating signal, the first pulse, after being progressively delayed, is registered to provide first sampled bits, and the second pulse, after being progressively delayed, is registered responsive to the digital oscillating signal to provide second sampled bits. The first sampled bits are summed to provide a first pulse width value, and the second sampled bits are summed to provide a second pulse width value.

BRIEF DESCRIPTION OF THE DRAWINGS

Accompanying drawings show exemplary embodiments. However, the accompanying drawings should not be taken to limit the embodiments shown, but are for explanation and understanding only.

DETAILED DESCRIPTION

Figure 1:
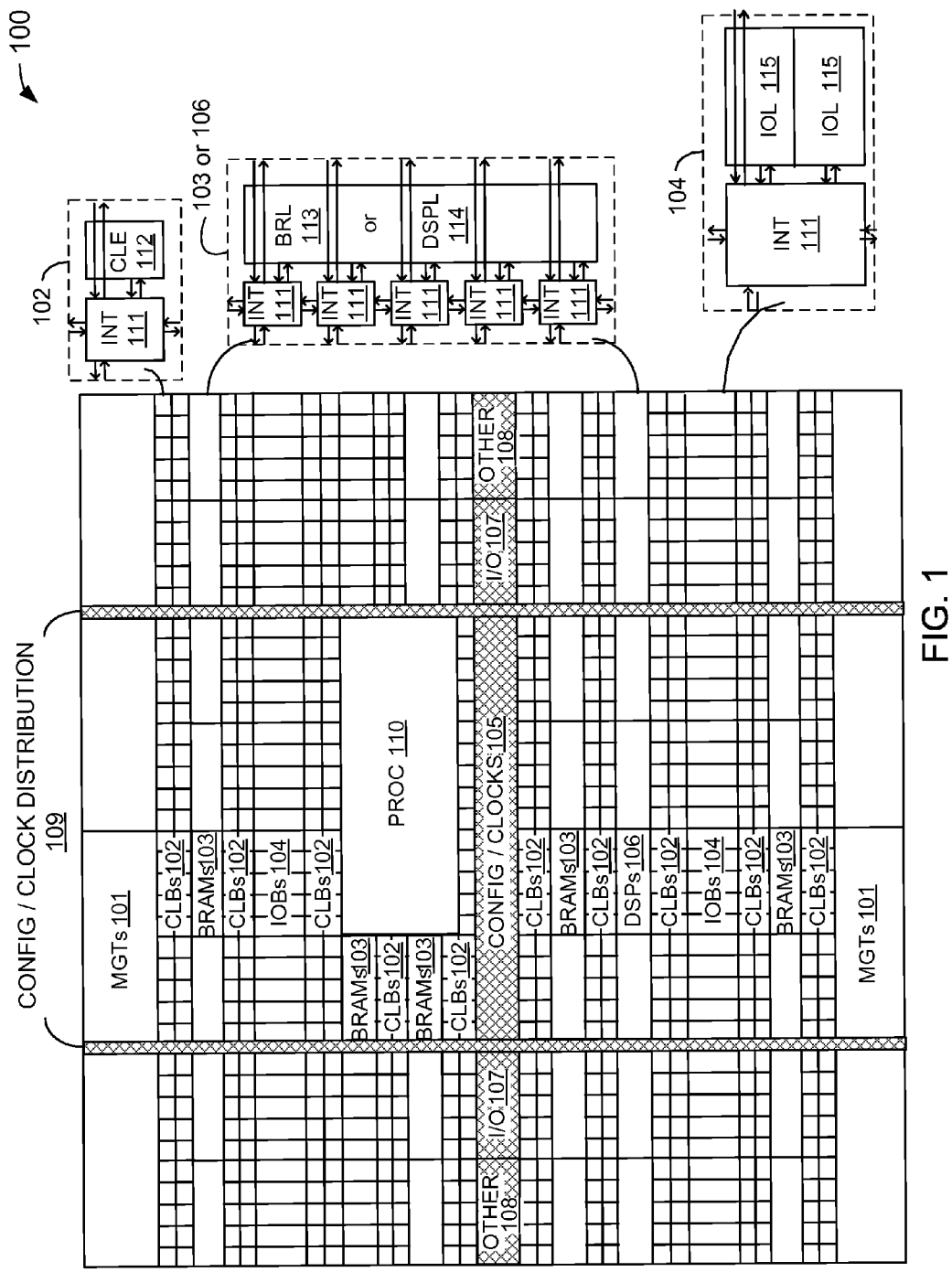
FIG. 1 is a simplified block diagram depicting an exemplary embodiment of a columnar Field Programmable Gate Array ("FPGA") architecture.

In the following description, numerous specific details are set forth to provide a more thorough description of the specific embodiments. It should be apparent, however, to one skilled in the art, that one or more embodiments may be practiced without all the specific details given below. In other instances, well known features have not been described in detail so as not to obscure one or more embodiments. For ease of illustration, the same number labels are used in different diagrams to refer to the same items; however, in alternative embodiments the items may be different.

Before describing exemplary embodiments illustratively depicted in the several figures, a general introduction is provided to further understanding.

Jitter can cause phase and/or frequency differences between signals, such as a reference clock signal and a digital oscillating signal phase locked or not to such reference clock signal. While fast sampling clocks for phase steering pulse capture and/or addition of an error or dither loop may be used as previously described, such circuitry adds cost and may not be practical or feasible in some ICs, as previously described.

With the above general understanding borne in mind, various embodiments for pulse width determination for phase detection are generally described below. Such embodiments may be instantiated in programmable resources, such as programmable fabric of a Programmable Logic Device ("PLD") for example, or may be implemented as an Application Specific Integrated Circuit ("ASIC") block. By determining pulse width values, an actual pulse width error value indicating a difference or phase error between two signals may be provided. Such actual pulse width error value may be used to control output of an oscillator to correct for such error, namely to reduce jitter. Enhanced phase resolution may be added into a digital phase detection circuit or system by use of delay chains to determine such actual pulse width error value. More particularly, phase resolution associated with such delay chains used to measure pulse width may be of a significantly finer granularity than a minimum pulse width of an output of a digital phase frequency detector ("PFD").

Because one or more of the above-described embodiments are exemplified using a particular type of IC, namely an FPGA, a detailed description of such an IC is provided below. However, it should be understood that other types of ICs may benefit from one or more of the embodiments described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

The FPGA contains regular and repeated structures, which makes it ideal for programmatically constructing various types (total length and per tap resolutions) of tapped delay elements, whether series of interconnects, CLBs, logic elements within CLBs, carry chains or other regularly spaced blocks or sub-blocks; groups of delays with even spacing may be constructed, although non-even delays may be calibrated for as well.

Figure 2:
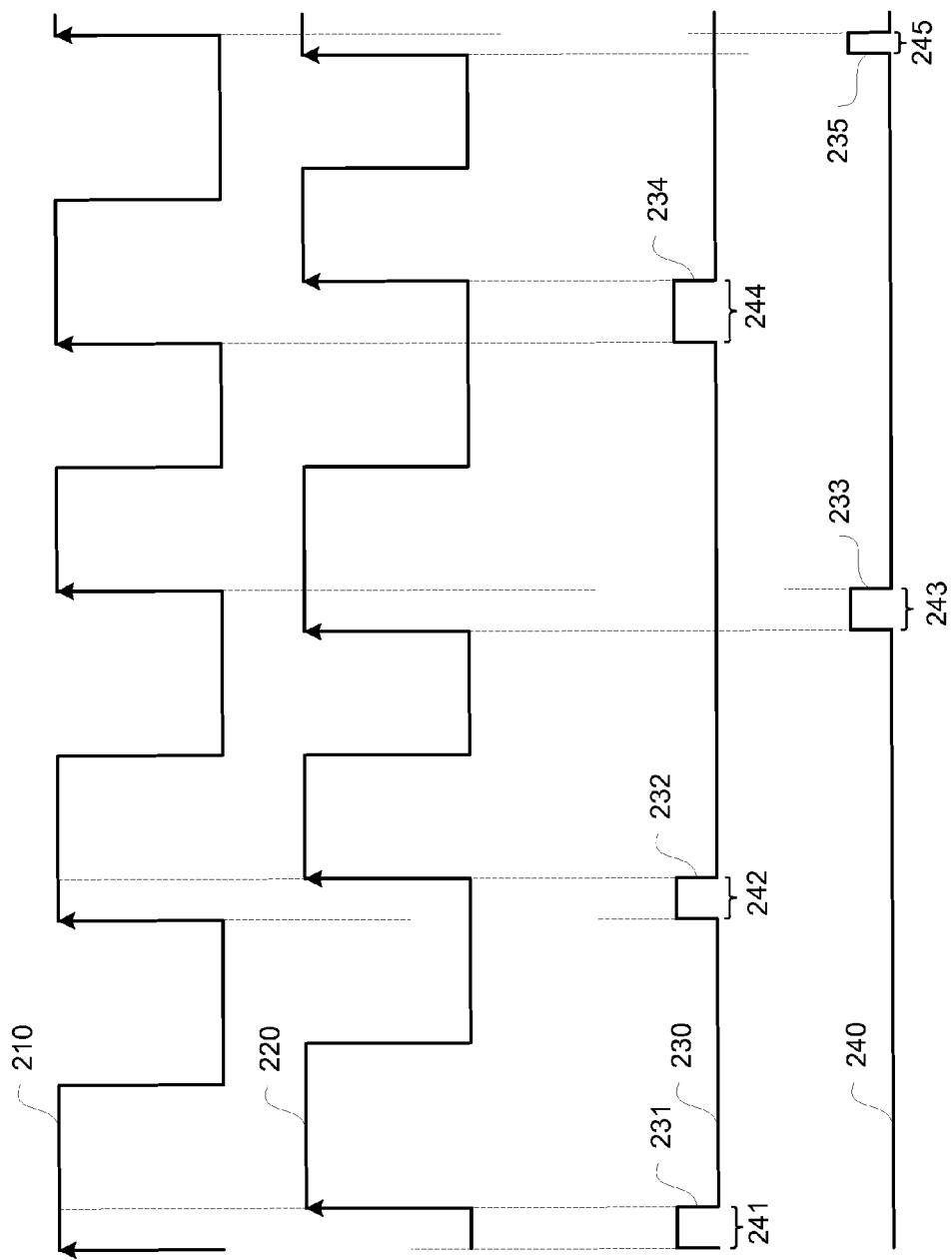
FIG. 2 is a signal diagram depicting an exemplary embodiment of inputs and outputs of a digital phase frequency detector ("PFD").

FIG. 2 is a signal diagram depicting an exemplary embodiment of inputs and outputs of a digital phase frequency detector ("PFD"). Input signal 210 and input signal 220 may be digital inputs to a digital PFD. Input signal 210 may be a reference signal input to which input signal 220 is compared against. However, just because input signal 210 is a reference signal does not mean that it cannot have any phase errors. It should be understood that for purposes of clarity not limitation input signals 210 and 220 are illustratively depicted having relatively similar frequencies and relatively periodic pulses. However, it should be understood more generally that input signals 210 and 220 may be any digital input signals that have some pulses which are to be phase and/or frequency compared with one another so as to determine a relationship between such input signals. Thus, such signals may have same or different frequencies and may or may not be clock pulses. However, for purposes of clarity and not limitation, it shall be assumed that input signal 210 is a digital reference clock signal, and that input signal 220 is a digital numerically controlled oscillating signal.

For purposes of clarity and not limitation, leading or rising edge phase and/or frequency detection is described. However, in other embodiments lagging or falling edge phase and/or frequency detection may be used. Furthermore, in still other embodiments, both rising and falling edge phase and/or frequency detection may be used.

Output error signal 230 and output error signal 240 are output from a digital PFD responsive to input signals 210 and 220. More particularly, pulses of output error signals 230 and 240 are provided responsive to phase and/or frequency differences between input signals 210 and 220. For purposes of clarity and not limitation, only phase differences are described, as frequency differences follow from the description herein.

Output error signal 230 includes pulses 231, 232, and 234 respectively corresponding to lagging phase differences 241, 242, and 244 as between input signals 210 and 220. More particularly, output error signal 230 includes pulses 231, 232, and 234 representing positive phase differences 241, 242, and 244, namely where reference input signal 210 leads input signal 220. Stated another way, input signal 220 lags phase of input signal 210 as detected at some discrete edges as indicated by pulses 231, 232, and 234. For purposes of clarity, output error signal 230 may be referred to as an "up" error signal to indicate an error signal with pulses associated with detected positive phase differences.

Output error signal 240 includes pulses 233 and 235 respectively corresponding to leading phase differences 243 and 245 as between input signals 210 and 220. More particularly, output error signal 240 includes pulses 233 and 235 representing negative phase differences 243 and 245, namely where reference input signal 210 lags input signal 220. Stated another way, input signal 220 leads phase of input signal 210 as detected at some discrete edges as indicated by pulses 233 and 235. For purposes of clarity, output error signal 240 may be referred to as a "down" error signal to indicate an error signal with pulses associated with detected negative phase differences.

Pulse width of pulses 231, 232, and 234 correspond to phase differences 241, 242, and 244, or more particularly the time differences respectively associated with such phase differences. Thus, for example, pulse 234 has a wider pulse width than pulse 232, as phase difference 244 is greater than phase difference 242. Likewise, pulse width of pulses 233 and 235 correspond to phase differences 243 and 245, or more particularly the time differences respectively associated with such phase differences. Thus, for example, pulse 235 has a narrower pulse width than pulse 233, as phase difference 245 is less than phase difference 243.

Figure 3:
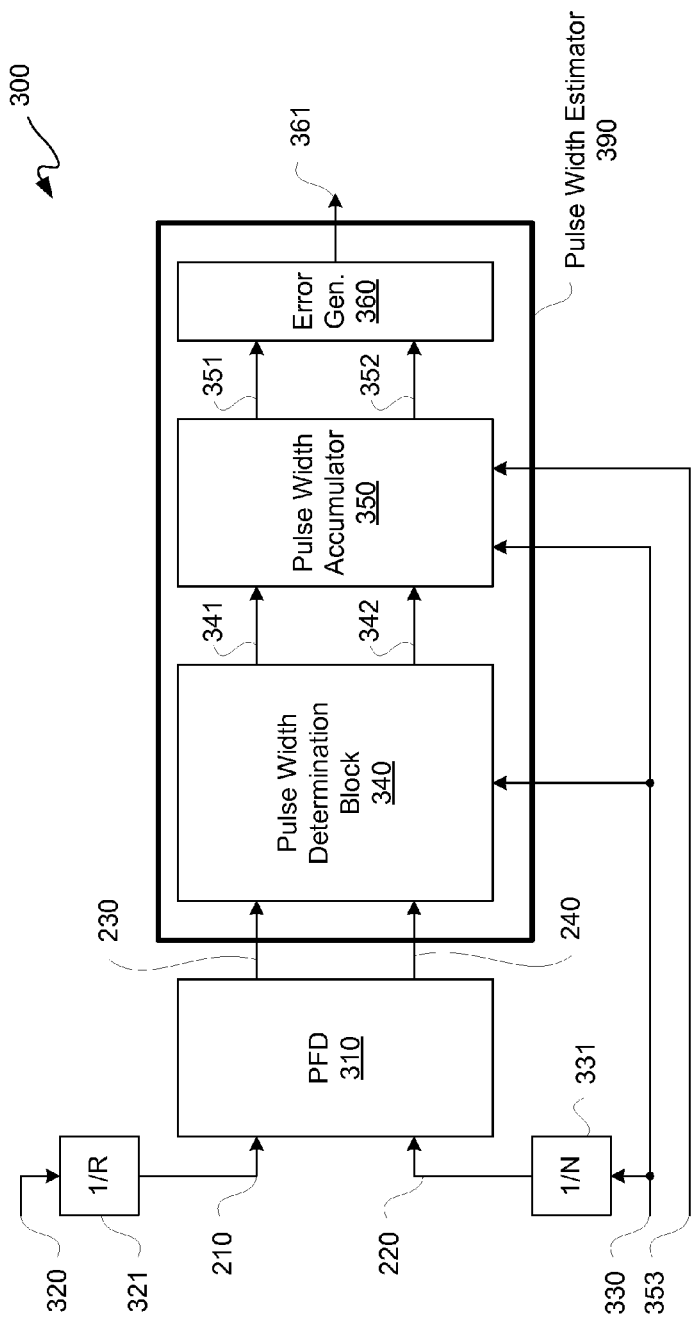
FIG. 3 is a block diagram depicting an exemplary embodiment of a pulse width determination system for phase detection.

FIG. 3 is a block diagram depicting an exemplary embodiment of a pulse width determination system 300 for phase detection. Pulse width determination system 300 includes pulse width estimator 390, digital PFD 310, divider 321, and divider 331. Pulse width estimator 390 includes pulse width determination block 340, pulse width accumulator 350, and error generator 360.

A reference signal 320, which may be a digital clock signal, may optionally be divided down by divider 321 to provide input signal 210. For example, input signal 210 may be a fraction 1/R, where R may be a positive number, of the frequency of reference signal 320. A digital oscillating signal 330, which may be a digitally numerically controlled oscillating signal, may be divided down by divider 331 to provide input signal 220. For example, input signal 220 may be fraction 1/N, where N is a positive number, of the frequency of digital oscillating signal 330. Generally, input signal 220 may be provided with a lower frequency than a sampling signal, such as digital oscillating signal 330. Values for N and R may generally be set to make input signals 210 and 220 approximately the same frequency when a system has reached an operational state, such as may be contrasted with a powering-up state or a power-on reset state for example. However, frequencies of input signals 210 and 220 may be equal or approximately the same. Generally, both input signal 210 and input signal 220 are provided with a lower frequency than a sampling signal, such as digital oscillating signal 330.

Input signals 210 and 220 are provided as inputs to digital PFD 310, as previously described with reference to FIG. 2, to provide output error signals 230 and 240. Digital PFD 310 may be a tri-state digital PFD. Output error signals 230 and 240, namely up error signal 230 and down error signal 240, respectively, are provided as inputs to pulse width determination block 340.

Pulse width determination block 340 is clocked with digital oscillating signal 330 to provide pulse width values 341 and 342. Pulse width value 341 is responsive to up error signal 230, namely a pulse width representative of a leading phase difference as previously described herein. Pulse width value 342 is responsive to down error signal 240, namely a pulse width representative of a lagging phase difference as previously described herein. To allow for additional pulse width determination setup time by pulse width determination block 340, digital PFD 310 may be responsive to phase differences as between rising edges of input signals 210 and 220; contrastingly registers, as described below herein, of pulse width determination block 340 may be responsive to falling edges of digital oscillating signal 330. However, in other embodiments, digital PFD 310 and pulse width determination block 340 may both be responsive to either leading or falling edges. In other embodiments, PFD 310 may be responsive to logic levels, such as an XOR circuit for example.

Pulse width accumulator 350 is coupled to receive pulse width values 341 and 342. Pulse width values 341 and 342 are clocked into pulse width accumulator 350 responsive to digital oscillating signal 330. A number of pulse width values 341 and a number of pulse width values 342 may be accumulated over a number of cycles of digital oscillating signal 330 before being clocked out of pulse width accumulator 350 as accumulated value 351 and accumulated value 352, respectively, responsive to a "clock" signal 353. Frequency of "clock" signal 353 may vary from application-to-application, as some users may want more or less pulse width values accumulated before outputting an average pulse width value, namely an up error average pulse width value 341 and a down error average pulse width value 342. Along those lines, clock signal 353 is described as a "user-defined" clock signal. However, it should be understood that a "user-defined" clock signal 353 in other embodiments may not be a periodic signal like a clock signal.

Frequency of user-defined clock signal 353 may be substantially less than frequency of digital oscillating signal 330. Effectively, by accumulating a number of pulse width values 341 and 342 over a number of cycles of digital oscillating signal 330, such values may be averaged out for providing an error value 361. However, in other embodiments, at least one pulse width value 341 and/or 342 may be accumulated responsive to at least one cycle of digital oscillating signal 330.

Accumulated values 351 and 352 are provided as input to error generator 360. Error generator 360 may determine a difference between accumulated values 351 and 352 to provide an error value 361. Error value 361 may be a pulse width difference between averages of pulses of output error signals 230 and 240. More particularly, error value 361 may be an average pulse width difference between reference input signal 210 and input signal 220, where such pulse width difference represents an average positive or negative phase and/or frequency difference between input signals 210 and 220. As previously indicated, this difference may be an average difference over cycles of digital oscillating signal 330 or may be an "instantaneous" difference over one cycle of digital oscillating signal 330.

Figure 4:
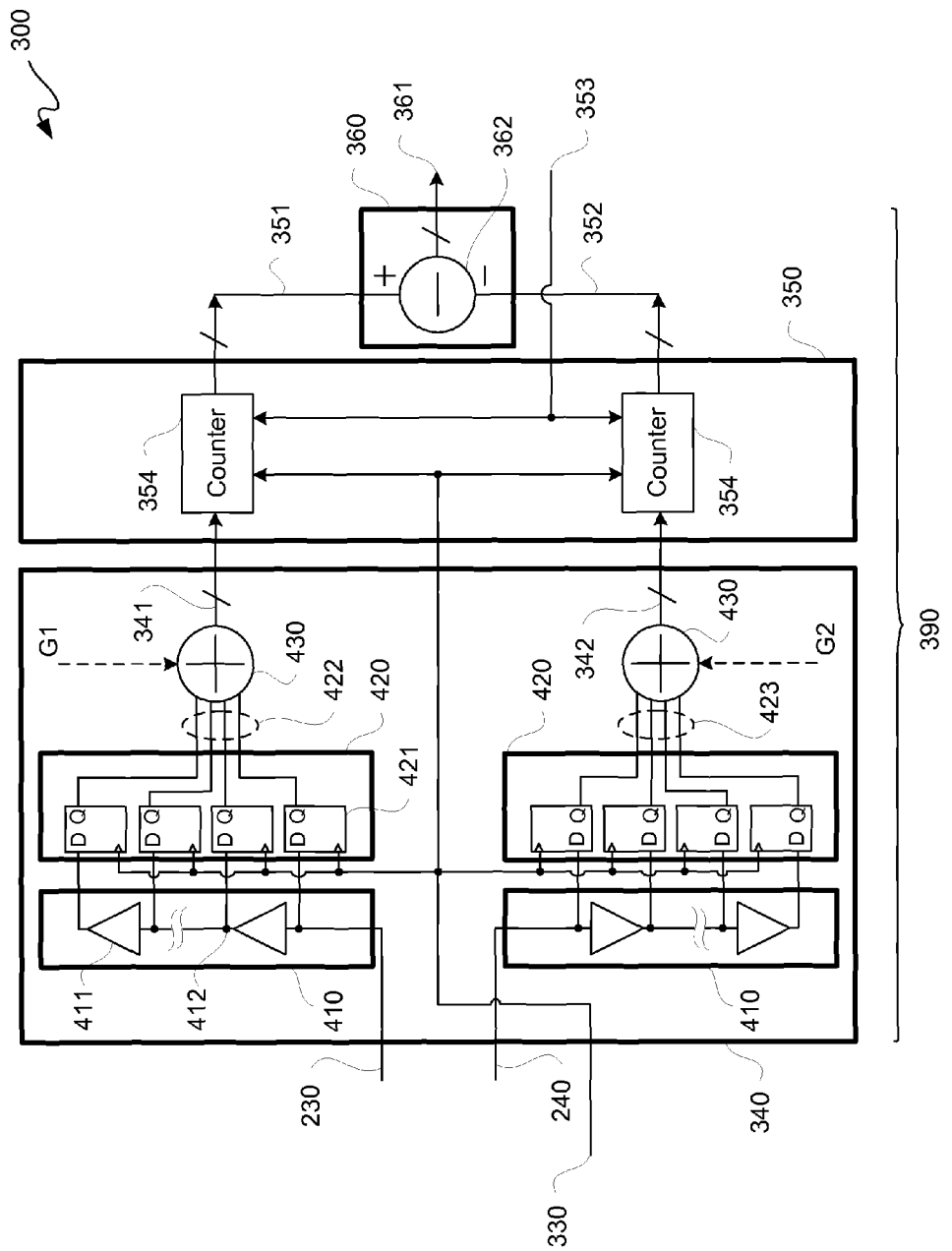
FIG. 4 is a block/circuit diagram depicting an exemplary embodiment of a pulse width estimator of the pulse width determination system of FIG. 3.

FIG. 4 is a block/circuit diagram depicting an exemplary embodiment of a pulse width estimator 390 of pulse width determination system 300 of FIG. 3. Pulse width determination block 340 of pulse width estimator 390 includes delay chains 410, register sets 420, and summers 430. Up error signal 230 is provided as an input to an upper delay chain 410, and down error signal 240 is provided as an input to a lower delay chain 410. As up and down portions of pulse width determination block 340 may effectively be the same, generally only an upper portion that receives up error signal 230 is described to avoid repetition.

Up signal 230 is provided to an input port of a first delay block, such as a first buffer 411 for example, and a first tap 412 of delay chain 410. A first tap 412 of delay chain 410 is coupled to a data input port of a first register 421 of a register set 420. Registers 421 may be delay type flip-flops or another type of clocked bit storage device. Registers 421 of register set 420 are clocked responsive to digital oscillating signal 330. Output of such delay block, such as a first buffer 411 for example, is provided to an input port of a second delay block, such as a second buffer 411 for example, and to a second tap 412 of delay chain 410. A second tap 412 of delay chain 410 is provided to a data input port of a second register 421 of register set 420, and so on.

A number of delay blocks, such as buffers 411 for example, and taps 412 of a delay chain 410 may be used to represent an overall delay length. Such overall delay length may be less than or approximately equal to a period of digital oscillating signal 330. Overall delay length of a delay chain 410 generally may be limited so as not to exceed a period of digital oscillating signal 330, so as to avoid pulse width determination block 340 sampling upon itself, as shall become more clear from the following description.

A digital PFD 310 may have at least an approximate minimum pulse width for each up and/or down error pulse output. Delay between taps 412 may represent a minimum tap delay length. Such minimum tap delay length, namely generally delay imposed by a buffer 411 for example, may be selected such that it is less than such an approximate minimum pulse width of an up and/or a down error pulse output from digital PFD 310. For purposes of clarity and not limitation, it shall be assumed that routing delays between delay chains 410 and sets of registers 420 is negligible; however, it should be appreciated that such routing delays may not be negligible in high-speed applications.

Delay resolution or pulse width resolution may depend upon such minimum tap delay length. Thus, pulse width resolution may depend on delay of each delay block of a delay chain 410, such as buffers 411 for example. For purposes of clarity and not limitation, it is assumed that minimum pulse width output from digital PFD 310 is the same for error signals 230 and 240, and thus delay chains 410 may be equivalent. However, in other embodiments, minimum pulse width output from digital PFD 310 may not be the same for both error signals 230 and 240, and thus delay of delay blocks of up and down delay chains 410 may be different.

Figure 5:
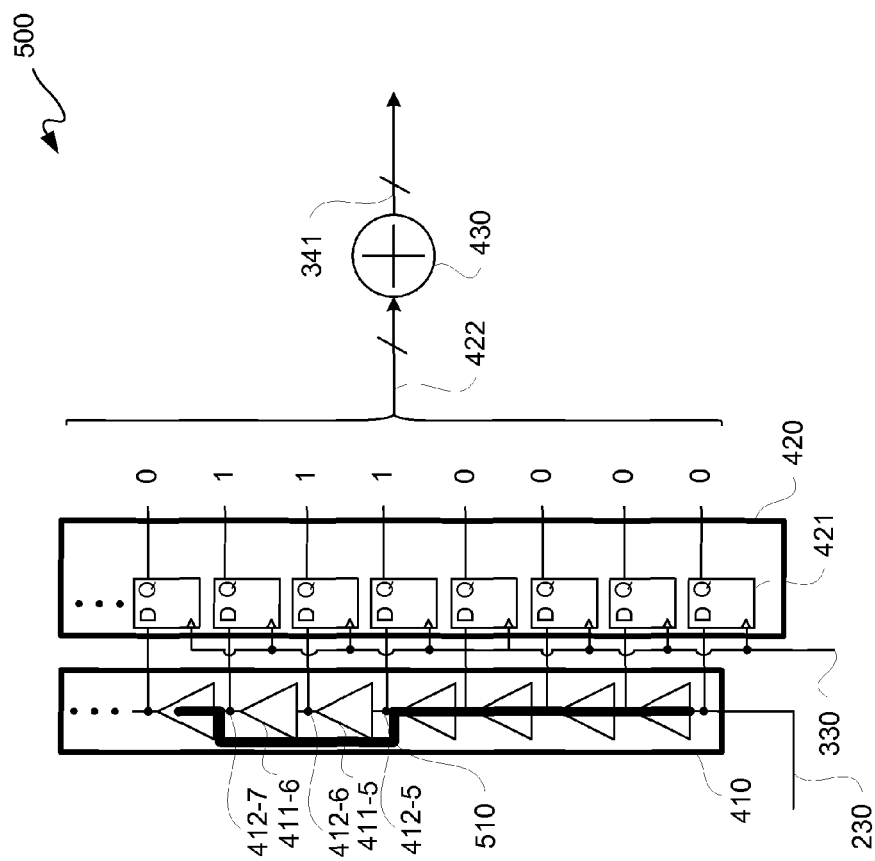
FIG. 5 is a block/circuit diagram depicting an exemplary embodiment of a delay chain and a set of registers of a portion of a pulse width determination block of the pulse width estimator of FIG. 4.

In operation, a pulse having a pulse width propagates along delay chain 410, and its pulse width is sampled responsive to digital oscillating signal 330. For purposes of clarity by way of example not limitation, FIG. 5 is a block/circuit diagram depicting an exemplary embodiment of a delay chain 410 and a set of registers 420 of an up error pulse width determination portion 500 of pulse width determination block 340 of FIG. 4.

In this example, pulse 510 has propagated through the first four buffers 411 of delay chain 410 and is effectively at taps 412-5 through 412-7 and buffers 411-5 and 411-6 of delay chain 410 when clocked responsive to, for example, a falling edge of digital oscillating signal 330 into registers 421 corresponding to taps 412-5 through 412-7. When registers 421 of register set 420 are clocked for output responsive to, for example, a subsequent falling edge of digital oscillating signal 330, outputs of registers corresponding to taps 412-5 through 412-7 may each provide a logic 1, and all other outputs of registers 421 may provide logic 0s. Generally, with accuracy limited by resolution of delay between taps 412, the number of logic 1s provided represents pulse width of pulse 510. The number of logic 1s in a continuous sequence output from registers 421 generally represents a pulse width of pulse 510, subject to such delay resolution.

Bits output from registers 421 may be provided as a sampled bits output 422 for input to summer 430. Summer 430 provides a sum of the number of logic 1s input as a pulse width value 341 output. In this example, pulse width value 341 is for a pulse width of pulse 510 of up error signal 230. As described below in additional detail, optionally up and down error summers 430 may each have input to them a respective plus or minus gain value, namely G1 and G2 respectively, as a result of calibration. Accordingly, it should be understood that summers 430 in other embodiments may have minus ports for input of a gain value.

In an embodiment, pulse width of a pulse, such as pulse 510 for example, may be captured anywhere along a delay chain 410 provided, however, total delay of such delay chain approximately equals but does not exceed a period of digital oscillating signal 330. Likewise, with renewed reference to FIG. 4, for a pulse of a down error signal 240, a sampled bits output 423 for input to a down error summer 430 may be captured anywhere along a delay chain 410 for sampling each pulse of down signal 240, and such summer 430 may provide a sum of a number of logic 1s input to registers 421 for a sampled pulse to provide a pulse width value 342 of a pulse of down error signal 240.

Figure 6B:
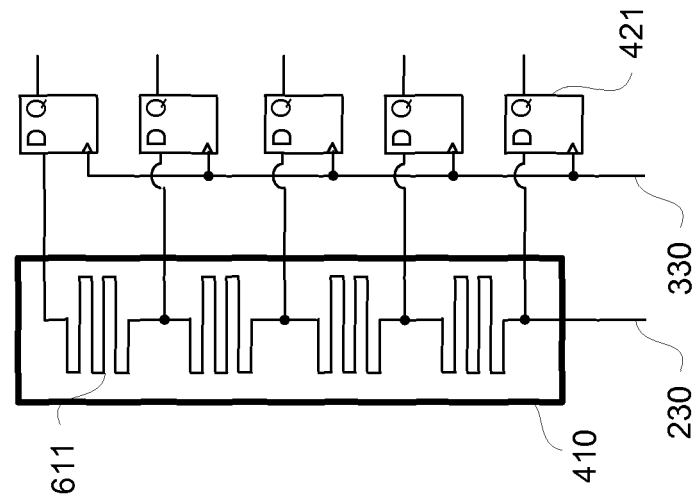
FIG. 6B is a block/circuit diagram depicting yet another exemplary embodiment of a delay chain.
Figure 6A:
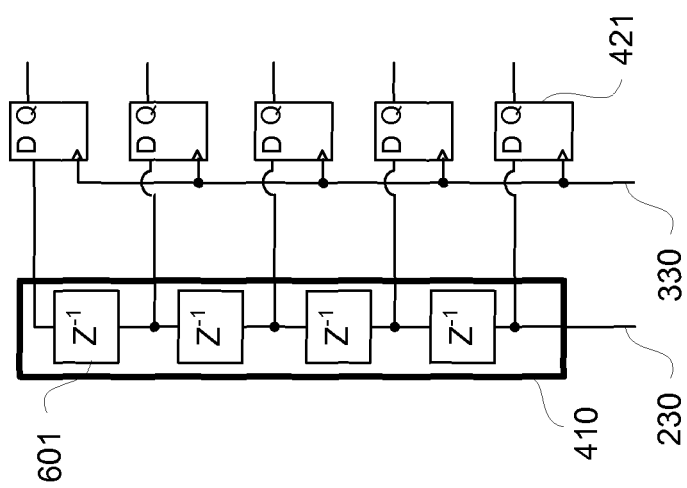
FIG. 6A is a block/circuit diagram depicting another exemplary embodiment of a delay chain.

FIG. 6A is a block/circuit diagram depicting another exemplary embodiment of a delay chain 410. In this exemplary embodiment of delay chain 410, a more generalized depiction of delay elements 601 is provided. Accordingly, delay blocks 601 of a delay chain 410 may be buffers, inverters, lookup tables, and/or other active devices capable of delaying a pulse with a sufficiently fine resolution as may vary from application-to-application. For example for an FPGA embodiment, delay chains 410 may each have a series of lookup tables or may each be a carry chain.

FIG. 6B is a block/circuit diagram depicting yet another exemplary embodiment of a delay chain 410. In this exemplary embodiment of delay chain 410, delay elements or blocks 611 are illustratively depicted as a passive devices. Thus for example, delay elements 611 may be serpentine lines which use signal propagation delay.

Accordingly, delay chains 410 may be used to effectively measure pulse width of pulses output from a digital PFD 310. The degree of resolution of such pulse width sampled values may be used to enhance linearity, such as linearity of a digital phase locked loop ("DPLL"). For example, if jitter affecting phase and/or frequency of a signal is generated in Loop Bandwidth ("LBW") of a system, degradation may be apparent in LBW and/or jitter gain transfer variation in the output of a DPLL. Additionally, such degradation may be evident as additive and/or unwanted phase jitter in such DPLL output.

By being able to measure pulse width of a digital PFD output with resolution sufficiently low for one gigahertz operation or faster, performance may be enhanced by improving low level PFD linearity, as described below in additional detail, for use in high-data rate applications. Along those lines, such resolution may be on the order of 300 picoseconds ("ps") or less, depending on delay chain implementation. For purposes of clarity by way of example not limitation, it shall be assumed that lookup tables of an FPGA are used to provide resolution on the order of approximately 200 ps. Such resolution may be used for example in a serial digital interface having a 2.970 gigabit per second serial link (namely, a 3G-SDI); however, other systems or other types of interfaces using gigabit data rates may be enhanced by pulse width sampling as described herein. More particularly, in an FPGA embodiment, a programmable fabric-base jitter reducing DPLL may be used to drive a high-speed gigabit serializer-deserializer ("SERDES") output directly using a transmit phase interpolator, such as a transmit phase interpolator as described in additional detail in U.S. Pat. No. 8,665,928, issued Mar. 4, 2014, entitled "Circuit for Generating an Output Clock Signal Synchronized to an Input Clock Signal", which is incorporated by reference herein in its entirety for all purposes. As described below in additional detail herein, a low jitter DPLL, which may be instantiated in programmable fabric, may be used to control a high-speed gigabit SERDES with sufficient accuracy when used in conjunction with such a phase interpolator as described in the above-referenced co-pending application.

By using delay taps to accurately register pulse width, a digital PFD 310 may have its resolution significantly enhance, which in turn may reduce a "dead zone" of such a PFD. A PFD "dead zone" generally is where small changes in relative signal phases, such between input signals 210 and 220 for example, are not detected. The effects of such undetected small changes may be exacerbated in a digital system where phase resolution is limited by a core clock, such as an FPGA core clock for example. By enhancing performance of a digital PFD 310 as described herein, net output of a DPLL may have less jitter. For purposes of clarity by way of example not limitation, for a 3G-SDI system, timing jitter may be reduced by approximately 90%, such as from approximately 2 unit interval ("UI") transients to approximately 0.2 UI transients.

Figure 7:
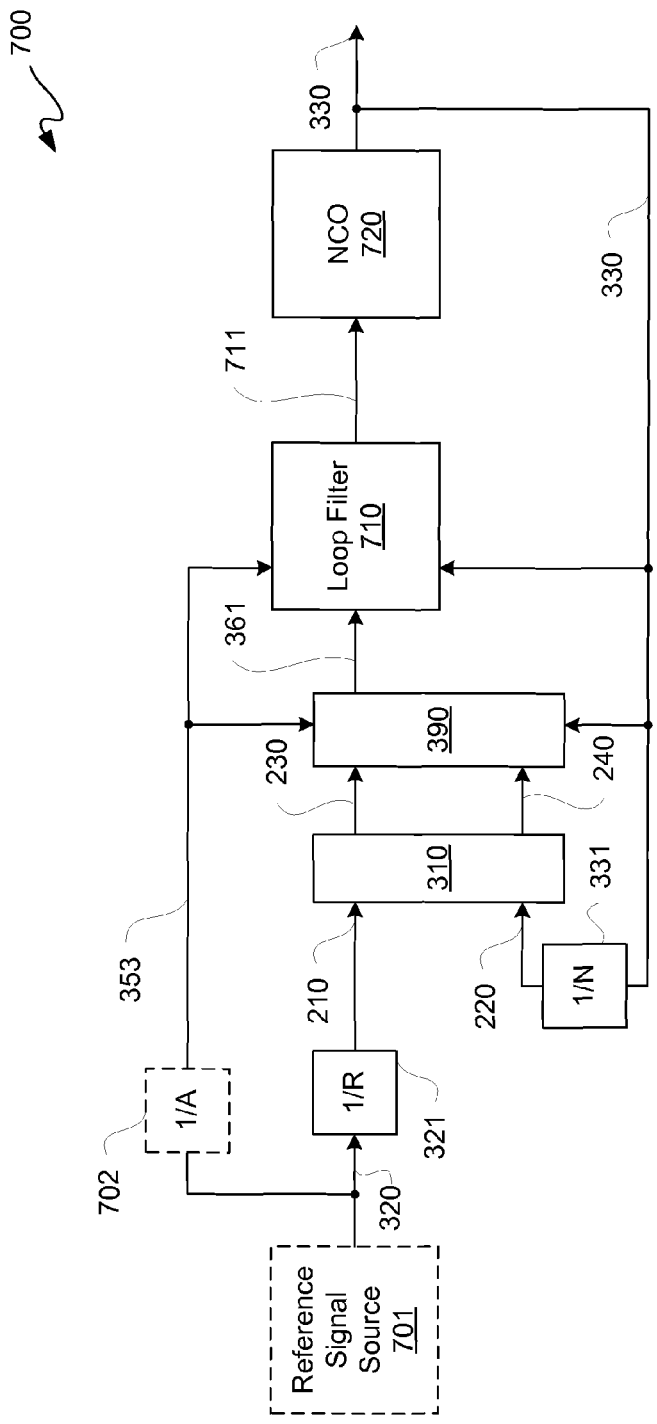
FIG. 7 is a block diagram depicting an exemplary embodiment of a digital phase lock loop ("DPLL") having the pulse width estimator of FIG. 4.

FIG. 7 is a block diagram depicting an exemplary embodiment of a DPLL 700. A reference signal source 701 provides a reference signal 320, such as a reference digital clock signal as previously described. Reference signal source 701 may be on-chip or optionally may be off-chip. Reference signal 320 may be provided to divider 321, as previously described, for providing input signal 210, namely a divided down version of reference signal 320, as previously described. As previously described, input signal 210 may be provided as an input to PFD 310. Additionally, reference signal 320 optionally may be provided to a divider 702 to divide down frequency of reference signal 320 to provide user-defined clock signal 353. Divider 702 may divide frequency of reference signal 320 by a value A, where A may be a positive number greater than N of divider 331. User-defined clock signal 353 may be provided to pulse width estimator 390 to clock out error value 361 for providing to loop filter 710. Optionally, user-defined clock signal 353 may be provided to loop filter 710.

As previously described, input signals 210 and 220 are provided as inputs to PFD 310 to obtain up error signal 230 and down error signal 240 for providing to pulse width estimator 390 responsive to clocking by digital oscillating signal 330. Pulse width estimator 390 may clock out error value 361 responsive to user-defined clock signal 353. Accordingly, an average error value 361, namely up and down accumulated error pulse width values over a number of cycles of digital oscillating signal 330 within a period of user-defined clock signal 353, may be output from pulse estimator 390 for input to loop filter 710.

Loop filter 710 may clock in error value 361 responsive to user-defined clock signal 353. Loop filter 710 optionally may be coupled to receive digital oscillating signal 330 for loop filtering error value 361 to provide a digital value 711. Digital value 711 is provided to numerically controlled oscillator ("NCO") 720. Responsive to digital value 711, NCO 720 outputs a revised error adjusted version of digital oscillating signal 330 for direct output and for feedback output, the latter of which is provided to pulse width estimator 390 and to divider 331 as previously described herein.

Accordingly, it should be understood that a low jitter DPLL capable of controlling a SERDES with high accuracy in conjunction with a phase interpolator, which may be incorporated into such SERDES, may be provided entirely on-chip respect to an FPGA. By providing feedback as described herein responsive to sampled pulse widths, digital oscillating signal 330 may be cleaned up to reduce DPLL error. In other words, output of PFD 310 may be driven such that output pulses of up error signal 230 and down error signal 240 are minimized for a system. For such a system, system error may be driven to 0 subject to phase resolution accuracy.

Figure 8:
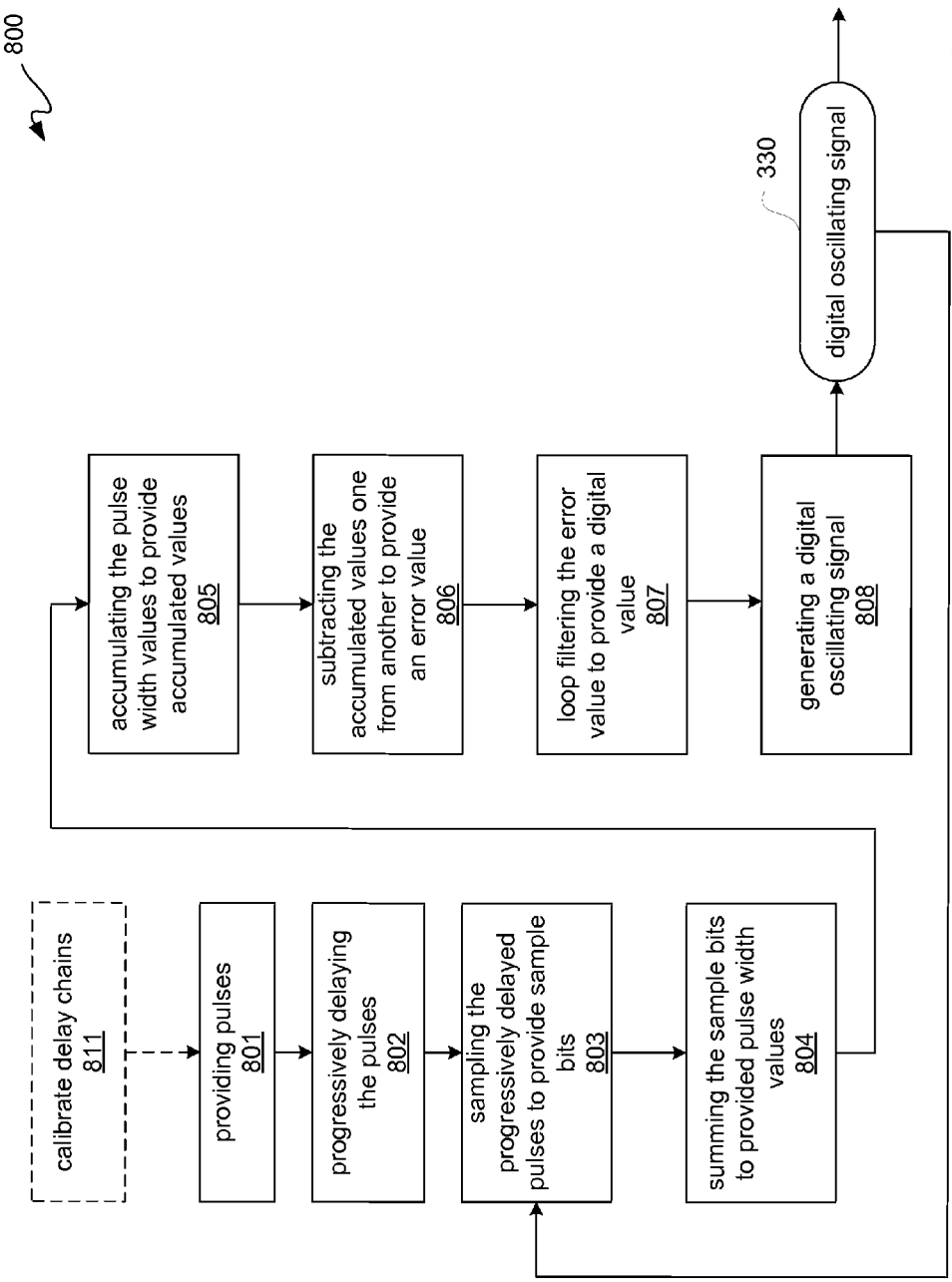
FIG. 8 is a flow diagram depicting an exemplary embodiment of a pulse width determination flow.

FIG. 8 is a flow diagram depicting an exemplary embodiment of a pulse width determination flow 800. Pulse width determination flow 800 is further described simultaneous reference to FIGS. 7 and 8.

At 801, pulses are provided responsive to differences between signals, such as input signal 210 and input signal 220. Such differences may be detected at 801 with a phase frequency detector 310 to provide such pulses. At 802, the pulses provided at 801 are progressively delayed with delay chains of pulse width determination block 390. As previously described herein, each pulse of such pulses is individually progressively delayed as provided through an associated up or down error delay chain, as previously described herein.

In DPLL 700, digital oscillating signal 330 may be a core DPLL clock. Pulses of up error signal 230 and down error signal 240 are input to respective delay chains 410, where overall delay length of such delay chains may represent an approximation of the period of such core DPLL clock, where individual taps of such delay chains may provide fine phase resolution pulse measurements. Digital PFD 310 in operation may have an approximate minimum pulse width output which is greater than a minimum length set between adjacent taps within delay chains 410.

At 803, the progressively delayed pulses of 802 are sampled to provide sampled bits. Such sampling may be performed responsive to digital oscillating signal 330 by clocking such sampled bits in and out of associated registers of pulse width determination block 390, as previously described herein.

At 804, such sampled bits provided at 803 are bit summed, such as in pulse width determination block 390, to provide binary values representing pulse width values. At 805, such pulse width values may be accumulated to provide accumulated values, such as in pulse width determination block 390. As previously described herein, such pulse width values may be accumulated over a number of cycles of digital oscillating signal 330 to provide such accumulated values.

At 806, such values accumulated at 805 are subtracted one from another, such as for example by subtractor 362, to provide a net result, where such net result may be an error value 361 equivalent to an input pulse width difference between input signals 210 and 220. Accordingly, such error value may indicate a phase difference between input signals 210 and 220.

At 807, such error value provided at 806 may be loop filtered to provide a digital value. At 808, such digital value provided at 807 may be provided to a numerically controlled oscillator to generate a revised version, namely an error adjusted or corrected version, of digital oscillating signal 330. Such digital oscillating signal 330 generated at 808 may be directly output and may be fed back for sampling progressively delayed pulses to provide sampled bits at 803 for at least one other up/down error pulse.

In normal operation, feeding back revised digital oscillating signal 330 may eventually cause digital PFD 310 to drive error of DPLL 700 to zero, or at least to some minimum pulse width value for output of PFD 310. If conditions exist such that digital PFD 310 error is large, such as for example when trying to establish a phase lock of input signal 220 to input signal 210, or when a large input jitter is present on either or both of input signals 210 and 220, delay count may saturate and a full-scale number may be accumulated or added in counters 354, as described elsewhere herein. Such a condition may be associated with adding sub-core clock sampling resolution equivalent to an average tap delay of delay chain 410. Accordingly, embodiments as described herein may be used in any application where an on-chip DPLL is employed, whether using programmable resources of programmable fabric or as an ASIC block or a combination thereof, where tracking resolution of a sub-core clock is employed, such as in an IEEE 1588 system for example. Using delay elements to measure pulse width of digital PFD outputs and bit summing sampled delay element values to obtain aggregate sub-core clock measurements may be used in a DPLL application fully instantiated in an FPGA.

Optionally, prior to or after use of delay chains 410, fine calibration of PFD 310 gain may be performed by providing a pulse of known width through such delay chains 410. Any gain to be added or subtracted from either or both of delay chains 410 may be accounted for by providing a positive or negative binary gain value. For example, with reference to FIG. 4, a plus or minus gain value G1 as determined by such fine calibration may be provided as a binary value to summer 430 for up error signal 230 pulses, and likewise a plus or minus gain value G2 as determined by such fine calibration may be provided as a binary value to summer 430 for down error signal 240 pulses. Accordingly, at 804, gain values may be provided for the summing of the sampled bits to provide pulse width values.

While the foregoing describes exemplary embodiments, other and further embodiments in accordance with the one or more aspects may be devised without departing from the scope thereof, which is determined by the claims that follow and equivalents thereof. Claims listing steps do not imply any order of the steps. Trademarks are the property of their respective owners.

What is claimed is:

1. An apparatus, comprising:
a detector configured for at least one of phase or frequency detection and coupled to receive a first input signal and a second input signal to compare pulses of the first input signal and the second input signal against one another to provide a first error signal and a second error signal respectively representing a positive difference and a negative difference in phase or frequency between the first input signal and the second input signal;
a pulse width determination block to receive the first error signal, the second error signal and a digital oscillating signal to output a first pulse width value and a second pulse width value respectively associated with the first error signal and the second error signal;
a pulse width accumulator to accumulate the first pulse width value and the second pulse width value over a number of cycles of the digital oscillating signal to provide a first accumulated value and a second accumulated value over the number of cycles; and an error generator to provide an error value as a difference between the first accumulated value and the second accumulated value;
wherein the error value represents a pulse width difference between the first input signal and the second input signal indicative of a phase difference between the first input signal and the second input signal.

2. The apparatus according to claim 1, wherein:
the first error signal includes a first pulse responsive to a first type of difference between the first input signal and the second input signal;
the second error signal includes a second pulse responsive to a second type of difference between the first input signal and the second input signal;
wherein the first type of difference and the second type of difference respectively are a positive phase or frequency difference and a negative phase or frequency difference; and
the pulse width determination block includes:
a first delay chain coupled to receive the first error signal; and
a second delay chain coupled to receive the second error signal.

3. The apparatus according to claim 2, wherein the pulse width determination block includes:
a plurality of first registers coupled to the first delay chain;
a plurality of second registers coupled to the second delay chain;
the plurality of first registers and the plurality of second registers coupled to receive the digital oscillating signal;
a first summer coupled to the plurality of first registers to provide the first pulse width value; and
a second summer coupled to the plurality of second registers to provide the second pulse width value.

4. The apparatus according to claim 3, wherein:
a plurality of first data inputs of the plurality of first registers are respectively coupled to a plurality of first taps of the first delay chain;
a plurality of second data inputs of the plurality of second registers are respectively coupled to a plurality of second taps of the second delay chain;
a plurality of clock inputs of the plurality of first registers and a plurality of clock inputs of the plurality of second registers are coupled to receive the digital oscillating signal;
a plurality of first data outputs of the plurality of first registers are coupled to the first summer to provide the first pulse width value;
a plurality of second data outputs of the plurality of second registers are coupled to the second summer to provide the second pulse width value;
the first type of difference is for phase lagging by the second input signal with respect to the first input signal;
the second type of difference is for phase leading by the second input signal with respect to the first input signal;
the first pulse width value indicates how much the second input signal lags the first input signal for a first detection; and
the second pulse width value indicates how much the second input signal leads the first input signal for a second detection.

5. The apparatus according to claim 4, wherein:
the pulse width accumulator includes a first counter and a second counter;
the first counter is to receive the first pulse width value to provide the first accumulated value;
the second counter is to receive the second pulse width value to provide the second accumulated value;
the error generator includes a subtractor to determine the error value as the difference between the first accumulated value and the second accumulated value; and
a divider to provide the second input signal as a divided down version of the digital oscillating signal.

6. The apparatus according to claim 2, wherein:
the first delay chain and the second delay chain each include a series of delay blocks; and
each delay block of the series of delay blocks has a delay smaller than a minimum pulse width of the detector for phase resolution sufficiently fine to reduce jitter introduced by the detector.

7. The apparatus according to claim 6, wherein the detector is a digital phase-frequency detector.

8. An apparatus, comprising:
a first delay chain to receive a first pulse associated with a first type of difference between a first input signal and a second input signal;
a second delay chain to receive a second pulse associated with a second type of difference between the first input signal and the second input signal;
wherein the first type of difference and the second type of difference are respectively a positive difference and a negative difference in either phase or frequency between the first input signal and the second input signal;
a plurality of first registers coupled to the first delay chain to register a first pulse width representation for the first pulse;
a plurality of second registers coupled to the second delay chain to register a second pulse width representation for the second pulse;
wherein the plurality of first registers and the plurality of second registers each have clock input ports for clocking the plurality of first registers and the plurality of second registers with a same digital oscillating signal to compare pulses of the first input signal and the second input signal against one another;
first summing circuitry coupled to first data outputs of the plurality of first registers to provide a first pulse width value for the first pulse width as a representation of the first pulse;
second summing circuitry coupled to second data outputs of the plurality of second registers to provide a second pulse width value for the second pulse width as a representation of the second pulse;
a pulse width accumulator to accumulate the first pulse width value and the second pulse width value over a number of cycles of the digital oscillating signal to provide a first accumulated value and a second accumulated value over the number of cycles; and
an error generator to provide an error value as a difference between the first accumulated value and the second accumulated value;
wherein the error value represents a pulse width difference between the first input signal and the second input signal indicative of either a phase or frequency difference between the first input signal and the second input signal.

9. The apparatus according to claim 8, wherein:
the first delay chain is coupled to receive each pulse of a first error signal as the first pulse; and
the second delay chain is coupled to receive each pulse of a second error signal as the second pulse;

first data inputs of the plurality of first registers are respectively coupled to the plurality of first taps of the first delay chain; and second data inputs of the plurality of second registers are respectively coupled to the plurality of second taps of the second delay chain.

10. The apparatus according to claim 9, wherein:

the first summing circuitry includes a first summer coupled to the first data outputs;

the second summing circuit includes a second summer coupled to the second data outputs;

the first type of difference is a positive phase difference between the first input signal and the second input signal;

the second type of difference is a negative phase difference between the first input signal and the second input signal;

the first summing circuitry is coupled to receive a first calibration gain; and the second summing circuitry is coupled to receive a second calibration gain.

11. The apparatus according to claim 8, wherein:

the first delay chain has a first series of delay blocks;

the second delay chain has a second series of delay blocks; and a delay block of the first series of delay blocks has a first delay smaller than a first minimum pulse width of the first pulse; and a delay block of the second series of delay blocks has a second delay smaller than a second minimum pulse width of the second pulse.

12. A method for determining pulse width, comprising:

detecting differences between a first input signal and a second input signal to provide a first error signal associated with a first type of difference and a second error signal associated with a second type of difference;

wherein the first type of difference and the second type of difference respectively are a positive difference and a negative difference in either phase or frequency between the first input signal and the second input signal;

progressively delaying, using a first delay chain, a first pulse of the first error signal;

progressively delaying a second pulse of the second error signal;

registering, by clocking registers with a digital oscillating signal, the first pulse progressively delayed to provide first sampled bits;

registering, by clocking registers with the digital oscillating signal, the second pulse progressively delayed to provide second sampled bits;

summing the first sampled bits to provide a first pulse width value; and summing the second sampled bits to provide a second pulse width value; and wherein the first pulse width value and the second pulse width value are comparable against one another to determine an error value therebetween.

13. The method according to claim 12, further comprising:

accumulating the first pulse width value and the second pulse width value over a number of cycles of the digital oscillating signal to respectively provide a first accumulated value and a second accumulated value; and subtracting the first accumulated value and the second accumulated value from one another to provide the error value;

wherein the error value is a pulse width difference which indicates a phase difference between the first input signal and the second input signal.

14. The method according to claim 13, wherein the detecting is performed with a phase frequency detector.

15. The method according to claim 13, wherein:

the first pulse and the second pulse are respectively progressively delayed with the first delay chain and a second delay chain; and the first pulse and the second pulse are respectively sampled from the first delay chain and the second delay chain with a first set of registers and a second set of registers.

16. The method according to claim 15, further comprising calibrating each of the first delay chain and the second delay chain with a calibration pulse of a known pulse width.

17. The method according to claim 16, further comprising providing a first gain value for the first delay chain calibrated and a second gain value for the second delay chain calibrated respectively for the summing with the first sampled bits and the second sampled bits.

18. The method according to claim 13, further comprising loop filtering the error value to provide a digital value.

19. The method according to claim 18, further comprising:

providing the digital value to a numerically controlled oscillator; and generating a phase jitter reduced version of the digital oscillating signal as an output from the numerically controlled oscillator.

20. The method according to claim 19, further comprising feeding back the phase jitter reduced version of the digital oscillating signal for the registering of the first pulse progressively delayed and the registering of the second pulse progressively delayed.

* * * * *